United States Patent [19]
Tokuyama et al.
[11] 3,767,483
[45] Oct. 23, 1973

[54] METHOD OF MAKING SEMICONDUCTOR DEVICES

[75] Inventors: Takashi Tokuyama, Higashikurume; Takaaki Mori, Hachioji; Hirotsugu Kozuka, Tokyo; Takao Miyazaki, Hachioji; Isao Yoshida, Kodaira; Shigeru Nishimatsu, Kokubunji, all of Japan

[73] Assignee: Hitachi, Ltd., Tokyo, Japan

[22] Filed: May 10, 1971

[21] Appl. No.: 141,921

[30] Foreign Application Priority Data

May 11, 1970 Japan .............................. 45/39306
May 22, 1970 Japan .............................. 45/43344
Nov. 2, 1970 Japan .............................. 45/95911

[52] U.S. Cl. .................. 148/186, 117/213, 148/1.5, 148/187, 156/17, 317/235 AG
[51] Int. Cl. .............................................. H01l 7/50
[58] Field of Search ....................... 148/1.5, 33, 187; 117/213; 317/235 AG; 156/17

[56] References Cited

UNITED STATES PATENTS

| | | | |
|---|---|---|---|
| 3,145,328 | 8/1964 | Letaw et al. | 317/235 AG |
| 3,409,979 | 11/1968 | Swamy et al. | 317/235 AG |
| 3,426,422 | 2/1969 | Deal | 117/213 X |
| 3,434,896 | 3/1969 | Chance | 317/235 AG |
| 3,511,703 | 5/1970 | Peterson | 317/235 AG X |
| 3,520,722 | 7/1970 | Scott, Jr. | 117/213 |
| 3,607,477 | 9/1971 | Rao et al. | 317/235 AG X |

*Primary Examiner*—L. Dewayne Rutledge
*Assistant Examiner*—J. M. Davis
*Attorney*—Craig, Antonelli & Hill

[57] ABSTRACT

The surface of a semiconductor substrate is exposed to an aqueous solution containing an alkali solution immediately before depositing an insulating film of $SiO_2$ or the like on that surface, whereby positive charges are induced in the surface of the semiconductor substrate which is covered with the insulating film.

21 Claims, 46 Drawing Figures

INVENTORS
TAKASHI TOKUYAMA, TAKAAKI MORI, HIROTSUGU KOZUKA,
TAKAO MIYAZAKI, ISAO YOSHIDA, SHIGERU NISHIMATSU
BY
Craig, Antonelli & Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU BY Craig, Antonelli + Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU BY Craig, Antonelli & Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU BY Craig, Antonelli & Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU
BY
Craig, Antonelli & Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU BY Craig, Antonelli & Hill
ATTORNEYS INVENTORS
TAKASHI TOKUYAMA, TAKAAKI MORI, HIROTSUGU KOZUKA
TAKAO MIYAZAKI, ISAO YOSHIDA, SHIGERU NISHIMATSU BY Craig, Antonelli & Hill
ATTORNEYS INVENTORS
TAKASHI TOKUYAMA, TAKAAKI MORI, HIROTSUGU KOZUKA,
TAKAO MIYAZAKI, ISAO YOSHIDA, SHIGERU NISHIMATSU BY Craig, Antonelli & Hill
ATTORNEYS

INVENTORS

TAKASHI TOKUYAMA, TAKAAKI MORI, HIROTSUGU KOZUKA,
TAKAO MIYAZAKI, ISAO YOSHIDA, SHIGERU NISHIMATSU

BY Craig, Antonelli & Hill
ATTORNEYS

INVENTORS
TAKASHI TOKUYAMA, TAKAAKI MORI, HIROTSUGU KOZUKA,
TAKAO MIYAZAKI, ISAO YOSHIDA, SHIGERU NISHIMATSU

BY Craig, Antonelli & Hill
ATTORNEYS

INVENTORS
TAKASHI TOKUYAMA, TAKAAKI MORI, HIROTSUGU KOZUKA,
TAKAO MIYAZAKI, ISAO YOSHIDA, SHIGERU NISHIMATSU

BY Craig, Antonelli & Hill
ATTORNEYS

INVENTORS
TAKASHI TOKUYAMA, TAKAAKI MORI,
HIROTSUGU KOZUKA, ISAO YOSHIDA,
TAKAO MIYAZAKI, SHIGERU NISHIMATSU
BY Craig, Antonelli & Hill
ATTORNEYS

METHOD OF MAKING SEMICONDUCTOR DEVICES

The present invention relates to a method of fabricating semiconductor devices in which the surface of a semiconductor substrate is treated with a solution containing an alkali solution immediately before covering the above-mentioned surface of the semiconductor substrate with an insulating thin film, thereby controlling, as desired, the electrical characteristics of semiconductor devices made from the semiconductor substrate.

It is well known that, in the fabrication of semiconductor devices, especially, those made of a silicon substrate, an insulating thin film of silicon dioxide, silicon nitride, lead glass, phosphorus glass or the like is formed on the surface of a semiconductor substrate in order to stabilize or control the electrical characteristics of the semiconductor devices. Particularly, the silicon dioxide film is used most often since it is comparatively easy to form in the case where the semiconductor substrate on which it is formed is made of silicon, and besides it is highly water-proof.

In forming a silicon dioxide film, it is customary in most cases to heat the silicon substrate in oxygen or water vapor at the temperature of 1,000° to 1,200°C, so that the surface of the silicon substrate is oxidized to form a silicon dioxide film on it. The silicon dioxide film thus formed, however, contains Na and other contaminating ions, and, what is more, negative charges are induced in the surface of the silicon substrate directly below the silicon dioxide film due to the structural disorder in the boundary between the silicon and the silicon dioxide. When the silicon dioxide film is 1 $\mu$ or less in thickness, negative charges as many as $10^{11}$ to $10^{12}/cm^2$ are induced in the surface of the silicon substrate as the result of the formation of the silicon dioxide film. Because of the negative charges thus induced, the surface of a silicon substrate of an N conduction type directly under the silicon dioxide film is made higher in the degree of N conduction. On the other hand, if the substrate is made of silicon of P conduction type, an N-type inversion layer with the resistivity of, say, 0.5 Ωcm or 4 Ωcm is formed directly under the silicon dioxide thin film by the induced negative charges of $10^{12}/cm^2$ or $10^{11}/cm^2$ respectively. This N-type inversion layer or the region in which the amount of the induced negative charges is made extremely high due to the silicon dioxide film is called an N-type channel in the semiconductor industry. The MOS field effect transistor is known as a semiconductor device that takes advantage of this N-type channel effectively.

Since the above-described high-temperature oxidization method for forming an $SiO_2$ film inconveniently requires a high temperature for heat treatment and enables the $SiO_2$ film to grow only at low speed, low-temperature treatment methods of various kinds are widely used to form an $SiO_2$ film in the manufacture of integrated circuits. In one of such methods, an organic silane, say, $Si(C_2H_5O)_4$ is thermally decomposed at the temperature of 150° to 800°C, while in another method a mixture of monosilane ($SiH_4$) and oxygen is reacted at the temperature of 280° to 400°C. Still another method is a high-frequency spattering using silica as a target. Of the above-mentioned three methods, the first two are grouped under a category of the vapor-phase reaction method, while the last of them is referred to as the direct-deposition method, the former being in use more widely than the latter.

The vapor-phase reaction method is applicable to the formation of an insulating film on the substrate not only of $SiO_2$ but other substances. For example, a film of $Si_3N_4$ may be formed on the surface of a semiconductor by reacting an $SiH_4$-$NH_3$ mixture at the temperature of 800° to 1,000°C. The vapor-phase reaction method finds application also where a thin film containing no $Al_2O_3$ or silicon is wanted to be formed on silicon or where the substrate is made of a different kind of semiconductor crystal such as Ge, GaAs or InSb. The insulating films including an $SiO_2$ film formed by the vapor-phase reaction method also induce electrons in the surface of the semiconductor under the films, the protective film formed at a low temperature by the vapor-phase reaction method generally developing a higher concentration of induced electrons in the surface of the substrate than the high-temperature oxidation method.

Apart from a semiconductor device such as the MOS field effect transistor, a surface region or channel with a high density of induced electric charges thus formed has a bad effect upon the electrical characteristics of the PN junction formed in the semiconductor substrate of a diode, transistor or integrated circuit. In other words, leakage currents of the PN junction are increased or the reverse breakdown voltage thereof is decreased. Therefore, it is generally more desirable that less electrons are induced in the surface of the substrate.

The high-temperature oxidation method of forming an $SiO_2$ film is fundamentally different from the vapor-phase reaction method in that, in the vapor-phase reaction method, the surface of the substrate is not consumed but maintains the original condition with a film being "laid" on the substrate, while, in the high-temperature oxidation method, the boundary between the film and the substrate moves gradually inwards from the surface of the substrate as it is oxidized. As a result, in the high-temperature oxidation method, the surface of the silicon substrate in the boundary between Si and $SiO_2$ is always kept clean. By contrast, according to the vapor-phase reaction method, the surface condition is maintained in the original state and therefore the characteristics in the boundary largely depend on how to treat the surface of the substrate immediately before depositing the insulating film on the substrate.

The present invention is intended to provide a method in which an insulating film of $SiO_2$ or the like is deposited immediately after effecting a special surface treatment taking advantage of the features of the vapor-phase reaction method, whereby the amount of induced negative charges is extremely reduced, or, not only it is reduced but even positive charges are induced.

One of the main features of the present invention lies in the fact that the semiconductor substrate is treated with a solution containing an alkali solution immediately before depositing an insulating film of $SiO_2$ or the like on its surface. It is, however, unknown to us why the amount of induced negative charges is reduced or, in some cases, even positive charges are induced in the surface of a semiconductor substrate when an insulating film is deposited on the surface of the substrate immediately after treating it with an alkali solution.

It is known that $NH_3$ molecules adhered to the surface of a semiconductor induce positive charges in it. In the present invention, the substrate is subjected to the reaction by the vapor-phase reaction method after boiling it in an aqueous solution containing $NH_4OH$ and then it is heated to the temperature of several hundred degree centigrade. Therefore, it will be a hasty conclusion to consider that the condition of reduced electrons in the substrate surface due to the adhered $NH_3$ molecules is maintained after the formation of the insulating film. On the contrary, by the above-mentioned treatment, a thin layer portion with such a structure as to induce positive charges may be formed at the silicon side in the boundary between Si and $SiO_2$.

In embodying the present invention, therefore, it is necessary to transfer to the step of forming the insulating film immediately after the formation of such a thin film, without going through any process for destroying the thin film. This is because the results of the inventor's laboratory tests show that the effect of the ammonia treatment, that is, the effect of reduction in the amount of induced negative charges is completely lost if, after the ammonia treatment, the substrate is boiled in rich nitric acid and an $SiO_2$ film is deposited on it as usual. The effect of the ammonia treatment, however, shows a considerable resistance to heat and this effect is evidently preserved after the reaction of monosilane and between $SiH_4$ and $NH_3$ to form an $SiO_2$ film and a silicon nitride film respectively at the temperatures of 300°C and 800° to 900°C. In the case of the $SiO_2$ film, the initial effect of ammonia treatment remains unlost even after the heat treatment at 1,000°C which has been effected following the depositing of the $SiO_2$ film.

The above and other objects, features and advantages will be made apparent by the detailed description of embodiments and effects of the invention taken in conjunction with the accompanying drawings, in which.

EMBODIMENT 1

Figure 1:
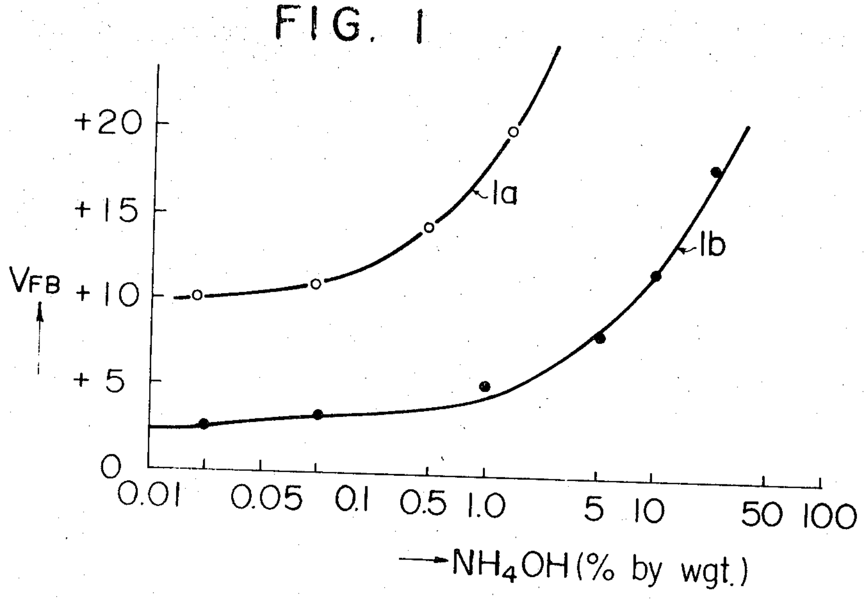
FIG. 1 is a graph based on tests conducted for showing the amount of charges induced in the surface of a semiconductor substrate when it is treated in an aqueous solution containing ammonia.

This embodiment concerns an experiment in which the effect of treatment of the substrate in an alkali solution is actually studied. An $NH_4OH$ solution is used in the following-described embodiment, but it is confirmed that the same effect is obtained with other alkali solutions such as NaOH or KOH.

A plurality of N-conduction type silicon substrates with the resistivity in the order of 100 Ωcm and with the main surface of (111) are formed by means of a well-known semiconductor technique. Such specimens are divided into three groups and each group of specimens is treated in the manners as mentioned below.

A. The surface of the specimens is treated with an etching solution consisting of HF and $HNO_3$ in the ratio of 2 to 3 in volume.

B. The specimens, after the treatment (A), are treated for 5 minutes in a boiling solution composed of $NH_4OH$, $H_2O_2$ and $H_2O$ in the ratio of 3 to 3 to 7 in volume.

C. After the treatments (A) and (B), the specimens are treated in rich boiling nitric acid for 10 minutes.

As soon as the above-mentioned three stages of treatments are completed, the specimens are placed in a furnace for heat treatment, in which the specimens are heated to the temperature of 300°C while a gas mixture of $SiH_4$ and $O_2$ in the ratio of 1 to 5 is introduced with nitrogen as a carrier gas. Thus, an $SiO_2$ film is deposited on the surface of the specimens. After the $SiO_2$ film becomes as thick as 5,000A, electrodes of Al 0.6 $\mu$ thick are deposited by evaporation on predetermined portions of the $SiO_2$ film in a well-known vacuum-depositing furnace, whereby what is called an MOS diode is obtained. Studying the relationship between the capacitance and the applied voltage of this MOS diode, the density of electric charges directly under the $SiO_2$ film was measured with the following results;

| Specimens | Density of Surface Charges |
|---|---|
| Specimens through treatment (A) | $4.0 \times 10^{12}/cm^2$ to $4.8 \times 10^{12}/cm^2$ |
| Specimens through treatment (B) | $-0.9 \times 10^{11}/cm^2$ to $-2 \times 10^{11}/cm^2$ |
| Specimens through treatment (C) | $1 \times 10^{12}/cm^2$ to $1.4 \times 10^{12}/cm^2$ |

It will be seen from this table that the polarity of the surface charges which went through treatment (B) is reversed in comparison with those through treatments (A) and (C), showing that positive charges are created at the silicon side of the specimens through treatment (B). This is a phenomenon which has never been discovered before. In other words, in any of the conventional methods of forming an oxide film, the layer of electric charges induced by the formation of the oxide film is one of electrons, whereas if the surface of a semiconductor is treated with an ammonia solution immediately before depositing an oxide film on it, the layer of electric charges under the oxide film is transformed into one of positive holes, thus forming a P-type channel.

In the next place, the specimens with an $SiO_2$ film deposited on their surfaces through treatment (B) were heated for 10 minutes in $N_2$ or Ar at the temperature of about 950°C. Then, the density of surface charges was found to be zero. This shows that not only is it possible to adjust the density of electric charges in the P channel by a subsequent heat treatment but the effect of treatment (B) can be maintained well through the heat treatment at a high temperature of 950°C which lasts as long as 10 minutes. As is clear from the results of treatment (C), the treatment (B) is effective when it is done immediately before the formation of the film.

EMBODIMENT 2

As in embodiment 1, a plurality of N-type silicon substrates with the resistivity of 100 Ωcm are prepared. In depositing an $Si_3N_4$ film on their surfaces by the vapor-phase reaction between $SiH_4$ and $NH_3$, the silicon wafers are divided into three groups immediately before the deposition of $Si_3N_4$, and the three groups of silicon wagers are treated in the following-described three different ways;

A. the wafers are etched at their surfaces with an etching solution consisting of HF and $HNO_3$ in the ratio of 2 to 3 in volume.

B. The surfaces of the semiconductors are treated for 6 seconds in a boiling solution composed of $NH_4OH$, $H_2O_2$ and $H_2O$ in the ratio of 3 to 3 to 7 in volume.

C. The surfaces of the semiconductors are treated for 100 seconds in a boiling solution composed of $NH_4OH$, $H_2O_2$ and $H_2O$ in the ratio of 3 to 3 to 7 in volume.

After the above-mentioned treatments, an $Si_3N_4$ film is formed and then, as in embodiment 1, electrodes of Al are deposited to form MIS (Metal Insulator Semiconductor) diodes. The density of electric charges created in their surfaces is shown in the table below.

| Specimens | Density of Surface Charges |
|---|---|
| Specimens through treatment (A) | $2.1 \times 10^{12}/cm^2$ |
| Specimens through treatment (B) | $1.6 \times 10^{12}/cm^2$ |
| Specimens through treatment (C) | $4 \times 10^{11}/cm^2$ |

As can be seen from above, the longer the specimens are treated in an ammonia solution, the more the density of charges in an N-type channel is reduced. In the combination of Si and $Si_3N_4$, however, the channel was not transformed from N to P type, no matter how long it is treated in the ammonia solution. The reason seems to be that more electrons originally exist in the surface of the silicon substrate in the combination of Si and $Si_3N_4$ than in the Si-$SiO_2$ combination and the treatment in the ammonia solution according to the present invention is not effective enough to remove all the electrons.

EMBODIMENT 3

FIG. 1 shows the results of our study as to how the amount of positive charges induced in the substrate surface when it is treated in an aqueous solution containing an alkali solution changes in accordance with the concentration of the alkali solution.

In this figure, the curved line 1a shows the results of our study, based on the capacitance-voltage characteristic of the MOS element involved and with the amount of $NH_4OH$ in the solution as a variable, of the voltage $V_{FB}$ (flat band voltage) impressed on the metal film to cancel the electric charges induced in the surface of the silicon substrate. In this case, a P-type silicon substrate 1 with the resistivity of 1 Ωcm, after being immersed for 10 minutes in an 80°C solution consisting of $NH_4OH$ and $H_2O$, is dried and an $SiO_2$ film 2 5,000A thick is deposited on its surface by thermal decomposition of silane. This is followed by the formation of Al electrodes 3 and 4 by plating or evaporation thereby to produce an MOS element as shown in FIG. 2.

It will be understood from this figure that the charges induced in the surface of the silicon substrate are of positive type and their amount is increased with the amount of $NH_4OH$. Similar results are obtained also when the substrate is treated in other alkali solutions including those of hydrazine and trimethylammonium hydroxide, or when other semiconductors such as Ge, GaAs, InSb and $GaAs_{1-x}P_x$ are involved.

Figure 2:
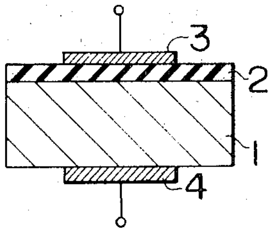
FIG. 2 is a diagram showing a longitudinal section of a metal oxide semiconductor element (called a MOS diode) employed in the tests in connection with the graph of FIG. 1.
Figure 4:
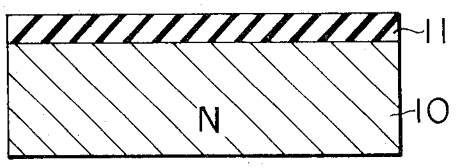
FIGS. 4 to 9 are diagrams showing longitudinal sections of an insulated gate field effect transistor in the process of manufacture by the method of the invention.
Figure 5:
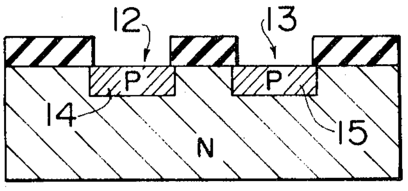

The curved line 1*b* of FIG. 1 shows the results of our study made to know how the amount of induced positive charges is affected when the specimen as shown in FIG. 2 is heated to the temperature of 800°C in an atmosphere of nitrogen and thereby the density of the $SiO_2$ film deposited on the substrate surface is increased. It is noted that the heat treatment has an effect upon the amount of induced positive charges. Especially when the silicon substrate is heat-treated at the temperature of 1,000°C or more in an oxidizing atmosphere, its surface is oxidized and the thin layer formed in the boundary between $SiO_2$ and Si by the alkali solution disappears, thus losing the effect of treatment in the alkali solution.

EMBODIMENT 4

The method according to this embodiment consists in controlling the amount of induced positive charges in the semiconductor surface by adding to the alkali solution an oxidizing agent such as a hydrogen peroxide solution. By cleaning the semiconductor substrate with this alkali solution containing oxidizing agent, a semiconductor is obtained which has an electrically stable surface with its flat band voltage $V_{FB}$ zero or in the vicinity thereof. Further, the flat band voltage $V_{FB}$ can be made negative by setting the mixture ratio at a predetermined level. This process will be explained below more in detail with reference to the present embodiment.

First, explanation will be made of a case in which a hydrogen peroxide solution is added to ammonia water. After ultrasonic cleaning of a semiconductor substrate by means of an organic solvent such as alcohol, the surface of the substrate is cleaned with a mixture solution according to the present invention consisting of ammonia water and hydrogen peroxide added to it. Then an $SiO_2$ film is formed on the surface by the chemical vapor deposition (CVD) method. After that, for example, an MOS diode is made by conventional semiconductor techniques and its flat band voltage $V_{FB}$ is measured by a predetermined measuring technique.

Figure 3:
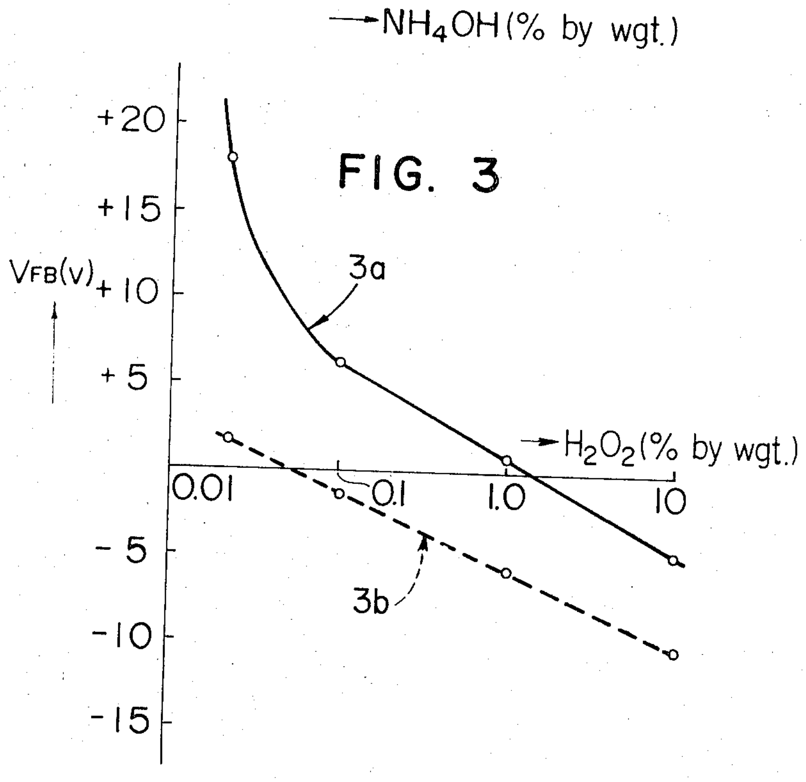
FIG. 3 shows how the amount of the induced charges changes when $H_2O_2$ is added to the alkali solution.

The relationship between the flat band voltage $V_{FB}$ and the weight percentage of the hydrogen peroxide solution in this case is shown in FIG. 3. These characteristic curves are the results of a laboratory test conducted according to a specified measuring technique in connection with an element with its substrate cleaned with a solution containing 14 percent ammonia and hydrogen peroxide added to it.

It will be noted from curve 3*a* that it is possible to reduce the flat band voltage $V_{FB}$ or it can be made negative by varying the amount of the hydrogen peroxide.

Incidentally, the fact that the flat band voltage is zero means the possibility of improvements in the characteristics such as reduced leakage currents and a higher breakdown voltage in the PN junction.

The broken line 3*b* shows a case in which the specimen in connection of which curve 3*a* is obtained is heated to 800°C in a nitrogen atmosphere.

EMBODIMENT 5

Explanation will made now of the treatments according to the present invention as they are applied to the fabrication of a semiconductor device. Processes of manufacturing P-channel depletion type field effect transistors are shown in FIGS. 4 to 9. For convenience of illustration, the essential parts are enlarged.

Figure 6:
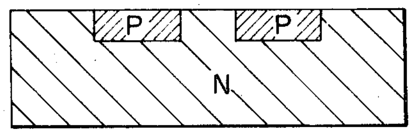
Figure 7:
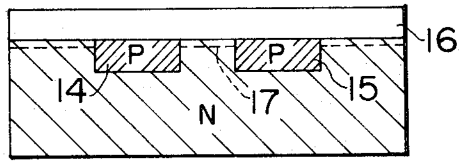
Figure 8:
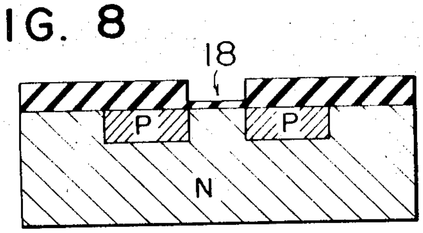

In the figures, the reference numeral 10 shows an N-conduction type silicon substrate, on the surface of which is deposited an $SiO_2$ film 11 by thermal decomposition of monosilane. Apertures 12 and 13 are created by photo-etching the predetermined parts of the $SiO_2$ film and then P-type impurities of boron are diffused through the apertures in an impurities diffusion furnace. Numerals 14 and 15 show P-type impurity-diffused regions thus formed, which respectively constitute source and drain regions of a MOS field effect transistor which will be described later. After that, the rest of the $SiO_2$ film on the surface of the semiconductor substrate is completely removed by etching. FIG. 6 shows the semiconductor substrate after the removal of the $SiO_2$ film. As the next step, the surface of the substrate is treated for several minutes in a boiling mixture solution of $NH_4OH$ and $H_2O$. It is then heated to about 300°C in a gas mixture of $SiH_4$ and $O_2$ with $N_2$ as a carrier gas thereby to form an $SiO_2$ film 16 500A thick on the surface of the silicon substrate. As was explained with reference to embodiment 1, positive charges are induced on the surface of the semiconductor substrate under the $SiO_2$ film 16 and thereby a P-type channel 17 is formed between a source region 14 and a drain region 15. The density of the charges in this channel is capable of being controlled, as desired, by varying the temperature at which the substrate is treated in the ammonia solution, its composition and the time for which the substrate is heated after the formation of the $SiO_2$ film. In order to reduce to 1,000A the thickness of the $SiO_2$ film 16 on the portion of the channel 17 between the source and drain regions, the $SiO_2$ film 16 is selectively etched with the aid of photo resist. Numeral 18 in FIG. 8 shows the portion of the $SiO_2$ film thus selectively etched. This $SiO_2$ film functions as a gate insulator film of an isolated gate field effect transistor. Next, the portions of the $SiO_2$ film above the source region 14 and the drain region 15 are selectively removed by photoetching and aluminium is deposited on the whole surface of the element, whereupon the portions of aluminium except those corresponding to the source and drain regions and the gate electrodes 19, 20 and 21 are removed by photoetching thereby to form a MOS field effect transistor.

Figure 10:
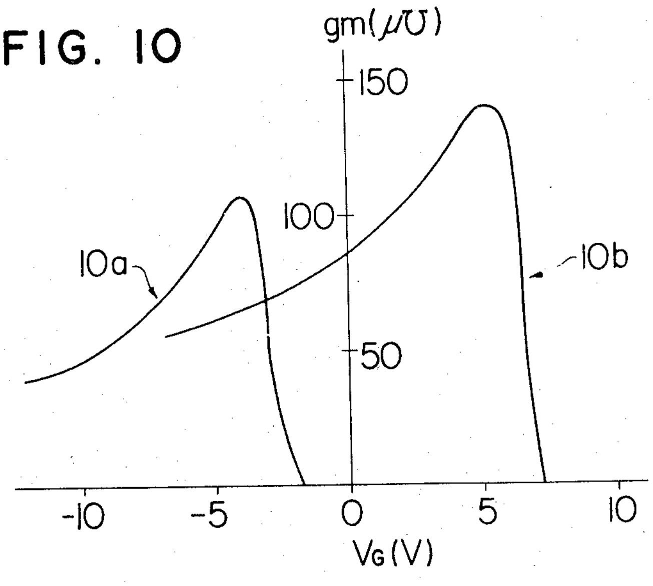
FIG. 10 is a graph showing the results of measurement of the transconductance of the IGFET of FIG. 9.

An electrical characteristic of the MOS field effect transistor thus produced is shown in FIG. 10, in which the characteristic of a transistor produced by a different treatment from the present invention is also shown for comparison. The curve 10*a* shows the transconductance of the conventional MOS field effect transistor not treated in an alkali solution, while curve 10*b* indicates that of the MOS FET treated in an alkali solution according to the present invention.

Figure 9:
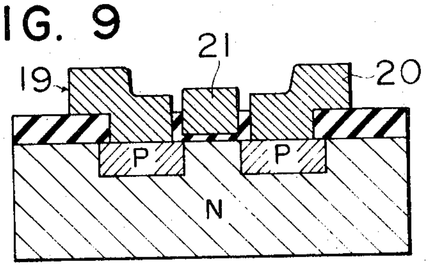

As is clear from the drawing, a great amount of positive charges are induced in the surface of the Si substrate directly under the gate insulating film. In addition, the transistor as shown in FIG. 9 possesses improved characteristics with its $g_m$ increased.

Most of the conventional MOS field effect transistors are of an N-channel depletion type and are easy to manufacture. Ranking next are those of the P-channel enhancement type and an N-channel enhancement type, with a very little amount of transistors of P-channel depletion type being manufactured. This is attributable to the fact that in the ordinary method of manufacturing transistors with the Si-$SiO_2$ combination, an N-type channel develops in the substrate surface and it is easy to manufacture those transistors in which currents between the source and drain regions are controlled in accordance with the degree of disappearance of the N-type channel by means of a voltage applied to their gates.

EMBODIMENT 6

The surface of the semiconductor substrate employed in the method of embodiment 5 is treated in this embodiment with a mixture of ammonia water, hydrogen peroxide and water in the ratio of 1 to 1 to 2 in volume, and further the density of the MOS field effect transistor is increased in a nitrogen atmosphere at 800°C.

Figure 11:
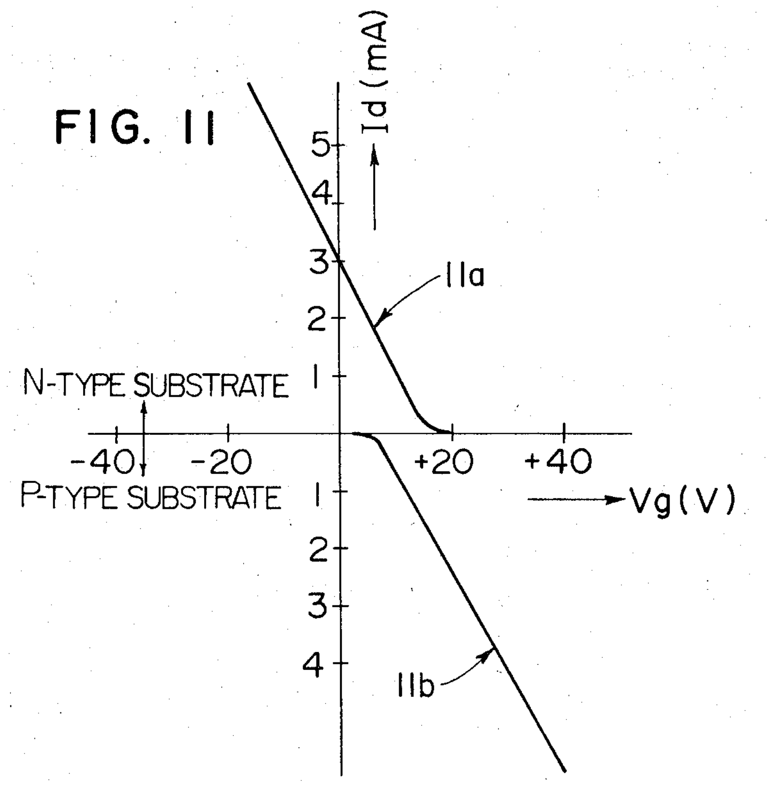
FIG. 11 is a diagram showing electrical characteristics of an IGFET fabricated in accordance with another embodiment of the present invention.

The electrical characteristics of the MOS field effect transistor formed by the above-mentioned treatment are shown in FIG. 11. The curved line 11*a* indicates that this transistor is of P channel depletion type. The curved line 11*b* shows the characteristics of a transistor according to this embodiment in which the semiconductor substrate is of P type and the source and drain regions are formed by diffusion of N-type impurities, thus producing a transistor of N-channel enhancement mode.

EMBODIMENT 7

This embodiment is concerned with a method of manufacturing semiconductor devices in which MOS transistors of both enhancement and depletion types are formed on the same semiconductor substrate by treating it with different solutions. A higher switching speed is obtained by a combination of MOS field effect transistors of enhancement and depletion types in a MOS integrated circuit. For example, if a depletion-type MOS field effect transistor is used as a load of an enhancement-type MOS field effect transistor, the switching operation of the circuit becomes much faster than if a resistor is connected as the load. Therefore, it is desirable that MOS field effect transistors of both enhancement and depletion types be combined on the same semiconductor substrate.

According to the present invention, positive charges can be induced in the surface of a semiconductor substrate directly under a gate insulating film and therefore it is possible to form a combined MOS field effect transistor of both enhancement and depletion types (called a complementary MOS field effect transistor) on the same semiconductor substrate by inserting a process of the treatment of the present invention in the middle of the processes for manufacturing one type of the MOS field effect transistors. The processes of manufacturing the complementary MOS field effect transistor are illustrated in FIGS. 12 to 17.

Figure 12:
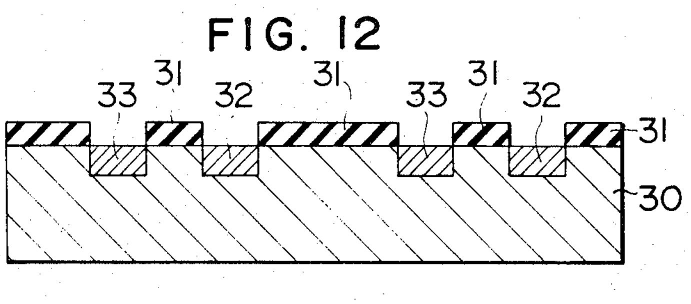
FIGS. 12 to 17 are diagrams showing the longitudinal sections of a complementary MOS FET fabricated in accordance with still another embodiment of the present invention.
Figure 13:
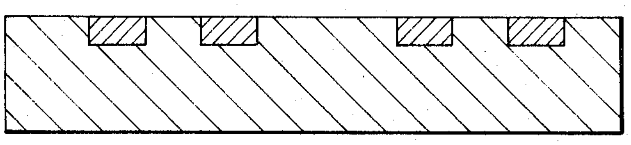
Figure 14:
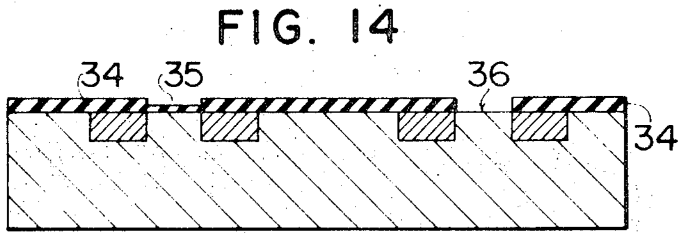

FIG. 12 is a sectional view of the complementary MOS field effect transistor wherein the source region 32 and the drain region 33 are formed by impurity diffusion in the P-type silicon substate 30 with an $SiO_2$ layer 31 about 5,000 A thick as a mask. After removing the $SiO_2$ layer 31 by means of hydrofluoric acid as shown in FIG. 13, the silicon substrate 30 is treated in a solution consisting of $H_2O_2$, $NH_4OH$ and $H_2O$ in the ratio of 1 to 1 to 2 in volume, and then it is cleaned with water and dried. Referring to FIG. 14, an $SiO_2$ layer 34 as thick as 2,000A is deposited on the substrate by oxidation of monosilane ($SiH_4$) and then a part of the $SiO_2$ layer is etched to the thickness of 1,500A to form a recess 35, while an aperture 36 is created at another part thereof by photoetching. The surface of the silicon substrate exposed through the aperture 36 is treated with $HNO_3$ and then washed with water and dried.

Figure 15:
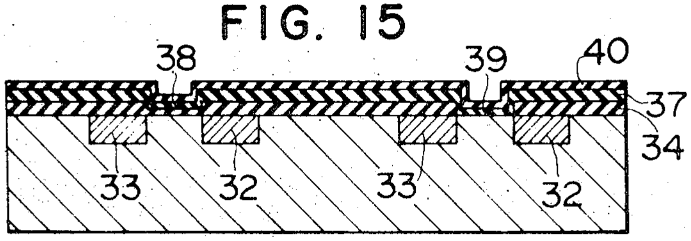
Figure 16:
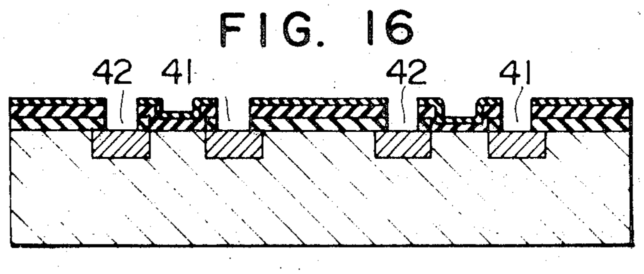

Processes of depositing another $SiO_2$ layer and a phosphorus glass layer are shown in FIG. 15. The $SiO_2$ layer 37 as thick as 2,000A is deposited by the oxidation of $SiH_4$. The portions 38 and 39 of this layer are etched off by about 1,500A. After that, the phosphorus glass layer 40 as thick as 1,000A is formed with $PH_3$ (phosphine) and $SiH_4$. In order to improve the electrical stability of the phosphorus glass layer 40, this element is heated for 10 minutes at 900°C and then, as shown in FIG. 16, apertures 41 and 42 are formed by photoetching to provide source and drain electrodes.

Figure 17:
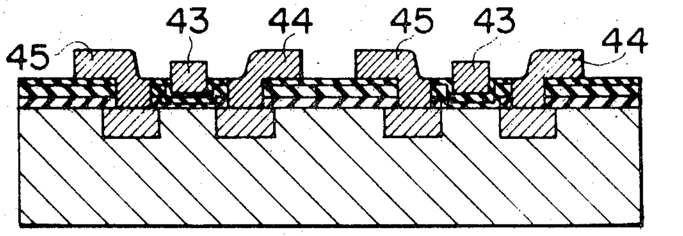
Figure 18:
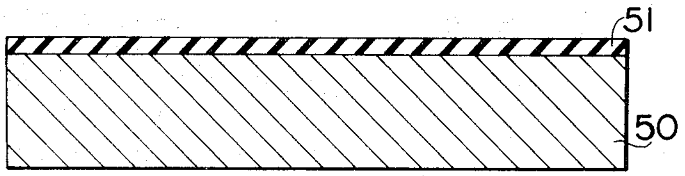
FIGS. 18 to 24 are diagrams for explaining still another embodiment of the present invention and show the process of fabricating MOS FET's isolated from each other.
Figure 19:
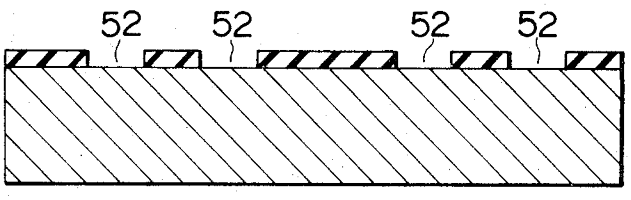
Figure 20:
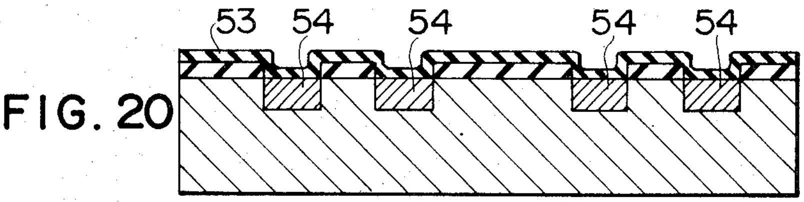
Figure 21:
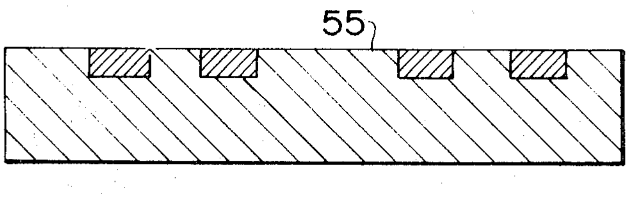
Figure 22:
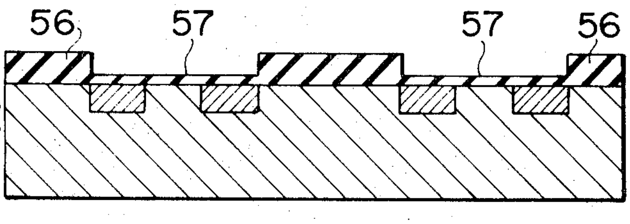
Figure 23:
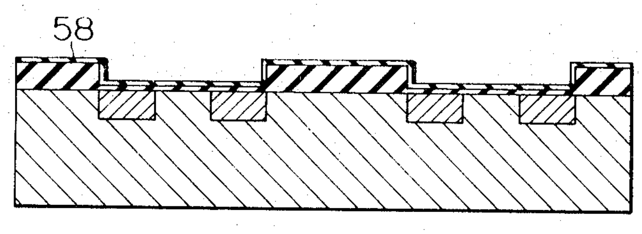

FIG. 17 shows the processes of forming the electrodes. A layer of conductive material such as aluminium is deposited to the thickness of 5,000A by a well-known method of vacuum deposition with the aid of a mask, thereby forming a gate electrode 43, a source electrode 44 and a drain electrode 45. Thus, as shown in the drawing, the enhancement type MOS field effect transistor (A) and the depletion type MOS field effect transistor (B) are formed on the same silicon substrate 30.

In this embodiment, the element is treated first with an alkali solution and then with an acid solution ($HNO_3$), and it is needless to say that the order of the processes may be reversed without any disadvantages.

The measurement of the flat band voltage $V_{FB}$ after the above-mentioned two treatments of the P-type silicon substrate and the deposition of an $SiO_2$ layer on it shows that $V_{FB} < 0$ for the substrate cleaned with an $HNO_3$ solution, indicating the conversion to N type, while V >0 for the substrate treated with an alkali solution, indicating no proof of conversion to N type. On the other hand, when the P type silicon substrate is first treated with the $HNO_3$ solution and then with the alkali solution, the amount of induced charges $N_{FB}$ is reduced, for example, from $8 \times 10^{11}cm^{-2}$ to $-4 \times 10^{11}cm^{-2}$. (where plus signs show negative charges, and minus signs positive charges.) This indicates that $N_{FB}$ can be controlled by the solutions for treatment.

As can be seen from the foregoing detailed description, this embodiment employs two different solutions to treat the silicon substrate. The processes are so simple that MOS field effect transistors of both enhancement and depletion types can be formed on the same semiconductor substrate. Further, this embodiment is different from the conventional methods in that, in this embodiment, a gate insulating layer which is made of only $SiO_2$ is easy to form, the element is more stable electrically with a phosphorus glass layer deposited on it, and $N_{FB}$ can be varied extensively in accordance with the composition and concentration of the solutions. Because of these advantages over the conventional methods, this embodiment is expected to prove of great value in industrial application.

EMBODIMENT 8

Embodiments hereafter described are concerned with electrical isolation between a plurality of MOS field effect transistors on the surface of the same semiconductor substrate by utilizing the positive charges induced in it by an alkali treatment. The isolation between MIS field effect transistors is very important in the manufacture of MIS IC's and MIS LSI's. (The word MIS means a metal insulator semiconductor and usually induces an insulation gate type field effect transistor, while the MOS field effect transistor uses an oxide layer as an insulating film.)

The short-circuiting between different MIS field effect transistors, if any, occurs either through a layer of induced charges (called a channel) which exists in the surface of a semiconductor substrate and is of the same conduction type as that of the source or drain region, or through a parasitic MIS field effect transistor which may be formed between the planned circuit elements with metal wirings between the elements as gate electrodes. In accomplishing isolation between the circuit elements, therefore, it is necessary to provide the threshold voltage $V_T$ of the parasitic MIS field effect transistor about three times as high as that of the circuit elements in order to prevent the channel from being developed in the surface of the substrate and to prevent the operative parasitic MIS field effect transistor due to the wirings on the insulating film. (The threshold voltage $V_T$ here means a gate voltage required for the channel to be developed.)

The conventional methods of manufacturing semiconductor devices employ a measure to assure isolation, in which the isolating spaces between elements are covered with a thick $SiO_2$ film if P-channel MIS field effect transistors are involved, so that the fact that the $SiO_2$ film induces electrons is utilized to prevent the source and drain regions of different MIS field effect transistors from being short-circuited with each other and at the same time the $SiO_2$ film is made thick enough to develop a high threshold voltage $V_T$ of the intermediate isolating portion between the elements and therefore to prevent parasitic MIS field effect transistors from being formed.

The above-mentioned $SiO_2$ film is not effectively used for the purpose of isolation of N-channel MIS field effect transistors because the $SiO_2$ film induces electrons in the surface of the semiconductor substrate. A well-known method of isolation of the N-channel MIS field effect transistors consists in raising the nominal value of the threshold voltage $V_T$ by applying a negative voltage to the semiconductor substrate. Although the above-mentioned method which uses only an $SiO_2$ film as an insulating material is easy to carry out, a separate power supply to apply a voltage to the substrate is needed. In addition, the application is limited to only one type of MIS field effect transistors on the substrate, and therefore the versatility of the circuit is restricted.

For this reason, the N-channel MIS field effect transistor has not yet reached the stage of commercial application in spite of its switching speed being about three to four times as high as that of the P-channel MIS field effect transistor.

This embodiment discloses a novel method of isolation which utilizes the fact that positive holes are induced in the surface of the semiconductor when a well-known insulating film is deposited on it after treating the surface with an alkali solution, and the resultant layer of positive holes is used for isolation between the N-channel MIS field effect transistors.

EMBODIMENT 9

FIGS. 18 to 24 are diagrams for explaining the processes of manufacture of the N-channel MIS field effect transistors utilizing an $SiO_2$ film and a phosphosilicate glass film as a gate insulating film and an isolation insulating film. The reference numeral 50 shows a P-type silicon substrate with the resistivity of 10 Ωcm having an $SiO_2$ film 51 as thick as about 5,000A formed on the surface thereof by heating it at a high temperature in water vapor. Apertures 52 are created by photoetching at predetermined portions of the $SiO_2$ film 51. A phosphosilicate glass film 53 is deposited at least in the apertures 52 to form the source and drain regions of each field effect transistor. Then the substrate 50 is heat-treated for about 60 minutes at 1,000°C whereby phosphorus in the phosphosilicate glass film in contact with the substrate surface is thermally diffused into the substrate thereby to form $N^+$ diffusion layers 54 which function as source and drain regions of each field effect transistor. After forming the source and drain regions in the substrate surface, the $SiO_2$ film 51 and the phosphosilicate glass film 53 are removed from it thereby to expose the surface 55. The substrate is immersed for 10 minutes in an ammonia solution maintained at 80°C and comprising $NH_4OH$, $H_2O_2$ and $H_2O$ in the ratio of 1 to 1 to 8. After drying it, an $SiO_2$ film 56 with the thickness of 5,000°A is deposited on its surface by the CVD method in which an element or compound is transformed from vapor phase to a solid state and forms a layer by a vapor-phase chemical reaction. For further detail of the method, please see pp. 532 to 538, Trans AIME Vol. 242 (1968).

After forming the $SiO_2$ film of the desired thickness, a recess 57 is formed in the $SiO_2$ film 56 by photoetching in order to reduce the thickness of the portion of the $SiO_2$ film above the gate region of each FET to about 500A. A phosphosilicate glass film 58 as thick as 500A is deposited from above the $SiO_2$ film by the CVD method. Apertures for providing electrodes in the source and drain regions of each FET are created by photoetching in the double layer of the $SiO_2$ film and phosphosilicate glass film. Aluminum of the thickness about 800A is deposited and those portions of aluminum not forming the electrodes of each FET are removed by photoetching, thereby forming source electrodes 59, drain electrodes 60 and gate electrodes 61.

Figure 24:
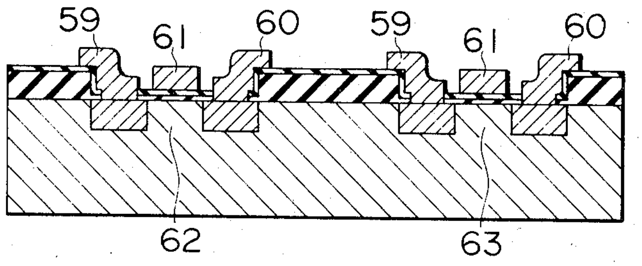
Figure 25:
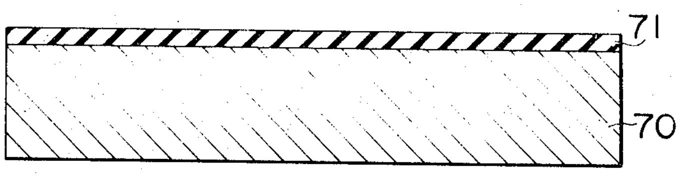
FIGS. 25 to 32 are diagrams showing longitudinal sections of a semiconductor device for explaining still another embodiment of the invention.
Figure 26:
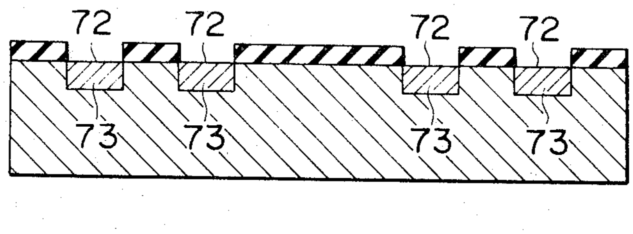
Figure 27:
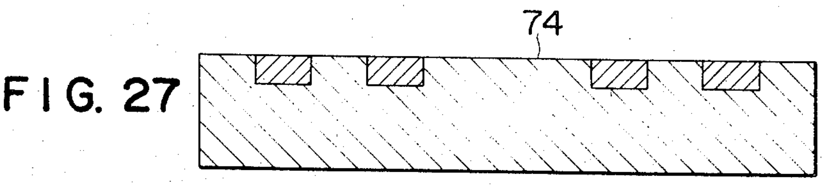
Figure 28:
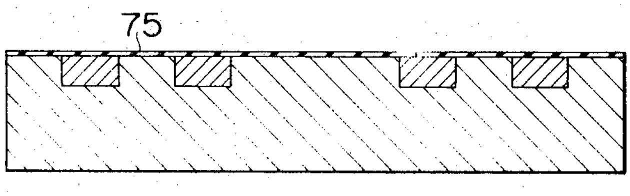

The N-channel MIS field effect transistor formed through the above-mentioned processes is shown in FIG. 24. In this figure, both of the first N-channel MIS field effect transistor 62 and the second N-channel MIS field effect transistor 63 formed in the surface of the P-type silicon substrate are of the enhancement mode with each FET sufficiently isolated. Since portions for isolation between the FET's are thicker than the insulating films is the gate regions, the capacitance between the substrate and the wirings above the insulating film is smaller and the threshold voltage $V_T$ of the parasitic MOS FET higher.

These manufacturing processes make it very easy to provide isolation, which has so far been difficult, between the N-channel enhancement type MOS field effect transistors formed in the surface of the P-type silicon substrate with an insulating film of $SiO_2$.

EMBODIMENT 10

FIGS. 25 to 32 show processes of manufacturing N-channel enhancement type MIS field effect transistors employing an isolation film of $Al_2O_3$.

An $SiO_2$ film 71 of the thickness 5,000A is formed by the high-temperature oxidization method on the surface of the P-type silicon substrate 70 with the resistivity 10 Ωcm and with the principal plane of (100). Apertures 72 are created by photoetching in the $SiO_2$ film 71 thereby to expose the portions of the substrate surface where source and drain regions are to be formed. $N^+$ diffusion layers 73 are formed in the exposed surface of the substrate by the diffusion of N-type impurities such as phosphorus, the $N^+$ diffusion layers 73 constituting the source and drain regions of each FET.

The $SiO_2$ film 71 on the surface of the silicon substrate is etched off completely to expose the surface 74. The substrate is immersed for about 10 minutes in an 80°C solution consisting of $NH_4OH$, $H_2O_2$ and $H_2O$ in the ratio of 1 to 1 to 8. After drying the substrate, its surface is deposited with an $SiO_2$ film 75 of the thickness 500A and an $Al_2O_3$ film 76 of the thickness 5,000 A successively by the CVD method. Thermal decomposition of monosilane is used to form the $SiO_2$ film 75, while, to form the $Al_2O_3$ film 76, the substrate is heated for 90 minutes at 400°C in a gas mixture of, for example, trimethyl-aluminum and oxygen.

After forming the $Al_2O_3$ film 76, the predetermined portions 77 of the film are etched off with a solution of phosphoric acid. The phosphoric acid solution acts on the $Al_2O_3$ film but not on the $SiO_2$ film which is left unremoved. After that, a $P_2O_5 \cdot SiO_2$ film 78 as thick as 500A is formed by the CVD method on the $Al_2O_3$ and $SiO_2$ films. Apertures for taking out source and drain electrodes of each FET are created by photoetching in the insulating film formed as above, and Al electrodes 79 and 81 as thick as 8,000A are formed by depositing aluminium. Numerals 79, 80 and 81 respectively show the source, drain and gate electrodes.

As the result of the above-described manufacturing processes, a semiconductor device is obtained in which there are formed in the surface of a P-type silicon substrate two N-channel enhancement type MIS field effect transistors isolated from each other. In this device, the threshold voltages $V_T$ of the FET's and the portions for isolation between the FET's are 0.5 V and 4 V respectively. The results of our measurement of variation in the threshold voltage $V_T$ with the specimen heated to about 250°C and an electric field of $10^6$ V/cm applied to its insulating film show that the value $\Delta V_T$ is 0.2 V or less. This indicates the very stable electrical characteristics of the specimen.

The portions which provide isolation in the conventional methods consist of only an $Al_2O_3$ film which is very unstable and unreliable with its $\Delta V_T$ more than 5 V. According to the present invention, however, high stability and reliability of the electrical characteristics are obtained.

The isolation provided according to this embodiment makes use of an insulating layer and therefore the concentration of positive holes induced in the semiconductor surface is elevated by the double action of an alkali solution and the $Al_2O_3$ film, thus resulting in a greater isolating ability than in Embodiment 1.

EMBODIMENT 11

Diagrams of FIGS. 33 to 40 show processes of manufacturing semiconductor devices employing alkali solutions of different concentrations for the gate region and the portions providing isolation.

An $SiO_2$ film 91 as thick as 5,000A is formed on the surface of a P-type silicon substrate 90 either by the CVD method or by spattering. Apertures 92 are created in the predetermined portions of the $SiO_2$ film by photo-etching. After depositing a phosphosilicate glass film about 3,000A thick on the silicon substrate by the CVD method, the substrate is heated at 1,000°C for an hour thereby to form $N^+$ diffusion layers 93 which act as the source and drain regions of each FET. The distance (channel width) between the source and drain regions in about 10 $\mu$.

After forming the $N^+$ diffusion layers, the $SiO_2$ film covering the gate regions is removed to expose the gate regions 94. The specimen is immersed for about 10 minutes in an 80°C alkali solution comprising $NH_4OH$, $H_2O_2$ and $H_2O$ in the ratio of 1 to 1 to 8, and after it is dried, an $SiO_2$ film 95 as thick as 500A is deposited on its surface by the CVD method. Then the portions of the $SiO_2$ film other than those above the gate regions are removed to expose the whole substrate surface. An $SiO_2$ film 98 500A thick, a $P_2O_5{\cdot}SiO_2$ film 99 500A thick and an $SiO_2$ film 100 5,000A thick are deposited in that order on the surface of the silicon substrate by the CVD method. The portions of the $SiO_2$ film 100 covering the gate regions of the FET's are selectively removed by photoetching. In order to form the FET's, apertures are created at predetermined portions of the insulating films 98 and 99 and electrodes of aluminium 8,000A thick are deposited in them. The source electrode 102, the drain electrode 103 and the gate electrode 104 thus formed are shown in FIG. 40.

This embodiment provides a method by which not only N-channel enhancement type MIS field effect transistors are capable of being formed in the surface of a P-type silicon substrate but isolation is provided between the FET's. Further, since the portions providing isolation between the FET's are treated with a high-concentration alkali solution, positive holes are induced in the isolating portions in a higher concentration than in the surface of the gate regions of the FET's, resulting in a high isolating ability.

Figure 40:
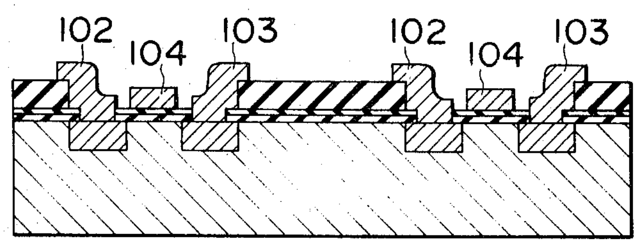
Figure 41:
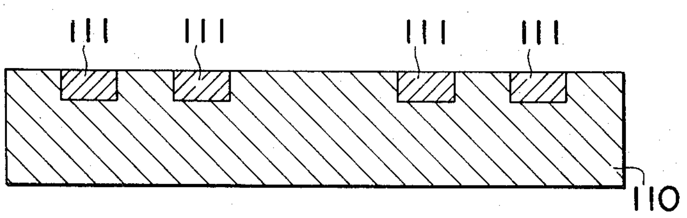
FIGS. 41 to 45 are diagrams for explaining still another embodiment of the present invention.
Figure 42:
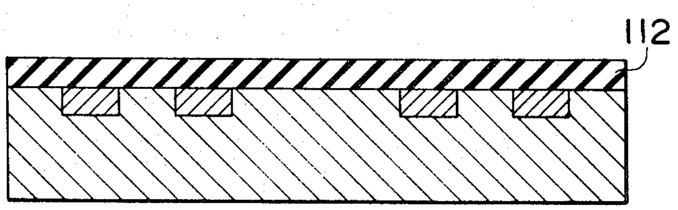
Figure 43:
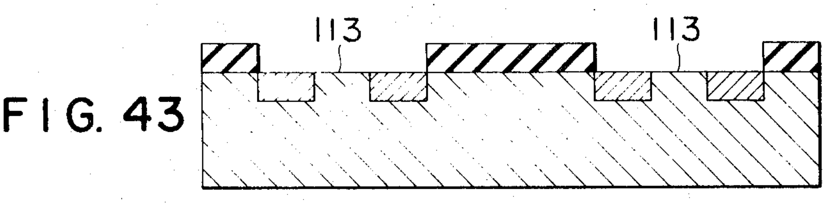
Figure 44:
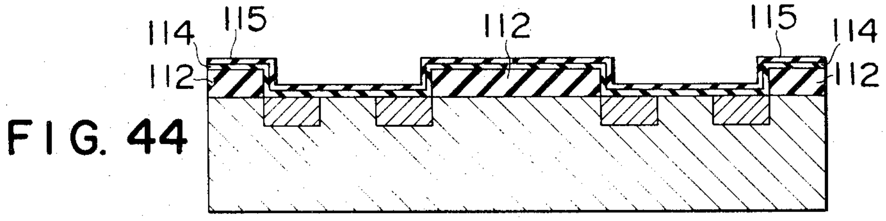
Figure 45:
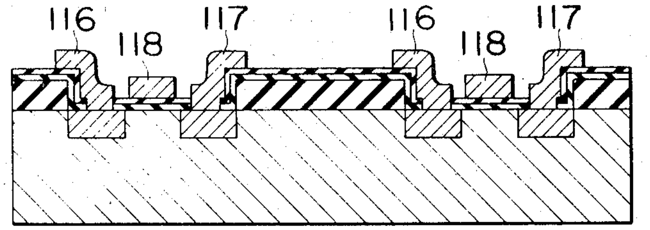

The electrical characteristics of the device as shown in FIG. 40 are almost the same as those of the embodiment 10.

EMBODIMENT 12

FIGS. 41 to 45 illustrate an embodiment using an $Al_2O_3{\cdot}SiO_2$ film as an insulating film for isolation.

Figure 46:
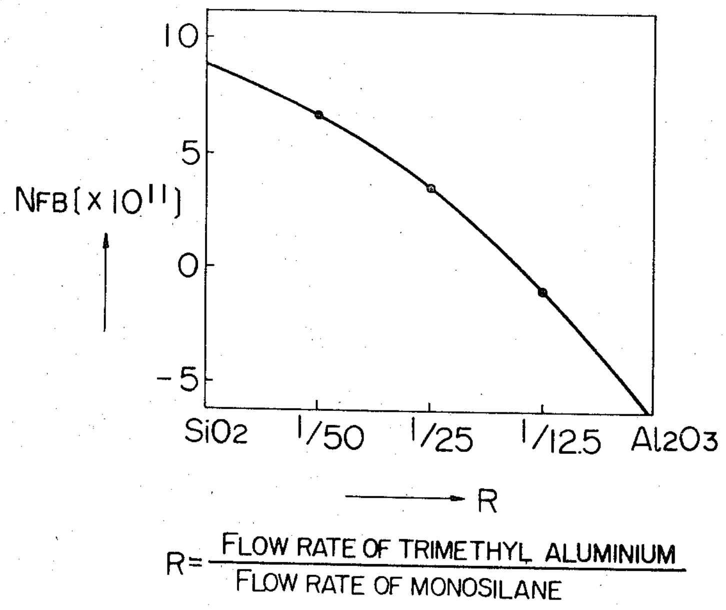
FIG. 46 is a graph showing the relation between the amount of positive charges induced in the surface of a semiconductor substrate when an aluminum silicate glass film in deposited on it and the amount of $Al_2O_3$ contained in the film.

$N^+$ diffusion layers 111 are formed in the surface of a P-type silicon substrate in the same manner as in embodiment 11. The surface of the silicon substrate is treated for about 10 minutes with an 80°C alkali solution consisting of $NH_4OH$, $H_2O_2$ and $H_2O$ in the ratio of 1 to 1 to 8, and after being dried, an aluminum silicate glass film 112 5,000A thick is deposited on it by the CVD method. In forming the aluminum silicate glass film by the CVD method, the silicon substrate is heated to about 1,000°C in a gas mixture of, for example, trimethyl-aluminium and monosilane. The concentration of positive holes induced in the surface of the silicon substrate is controlled by varying the amount of $Al_2O_3$ in the aluminum silicate glass film. FIG. 46 shows the relationship between the amount of $Al_2O_3$ in the aluminum silicate glass film deposited on the surface of the silicon substrate and the amount of charges induced in the substrate surface. It is understood from the graph that the concentration of positive holes induced in the substrate surface becomes higher as the amount of $Al_2O_3$ in the aluminum silicate glass film is increased.

The amount of $Al_2O_3$ in the aluminum silicate glass film is easily controlled by regulating the relative amount of trimethyl-aluminum vapor with respect to the monosilane vapor in forming aluminum silicate glass film by the CVD method.

Figure 29:
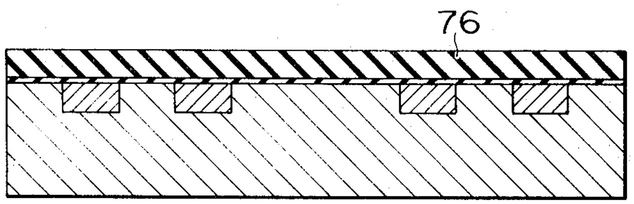
Figure 30:
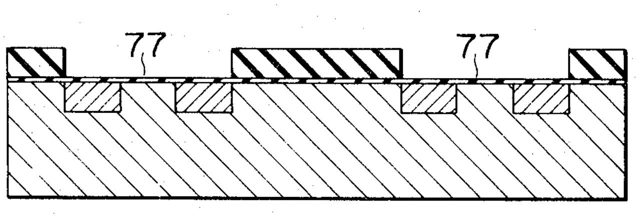
Figure 31:
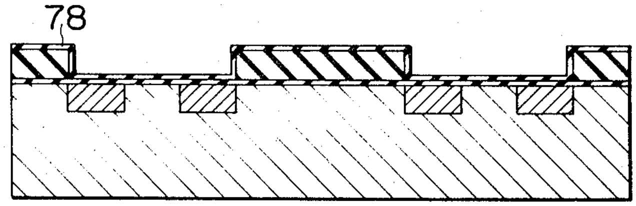
Figure 32:
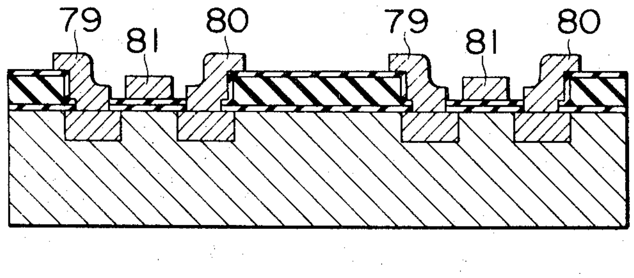
Figure 33:
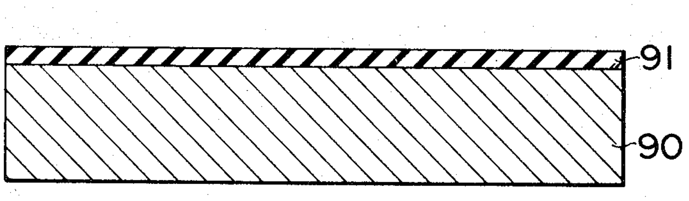
FIGS. 33 to 40 show longitudinal sections of a semiconductor device for explaining still another embodiment of the present invention.
Figure 34:
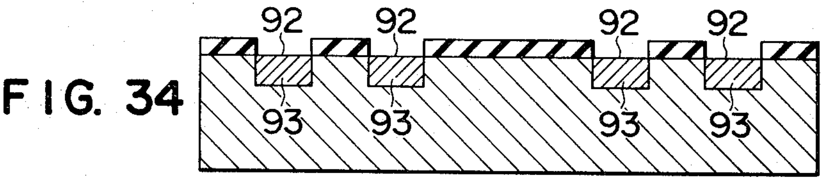
Figure 35:
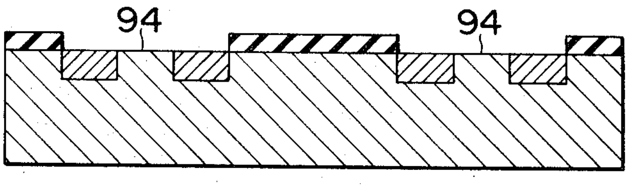
Figure 36:
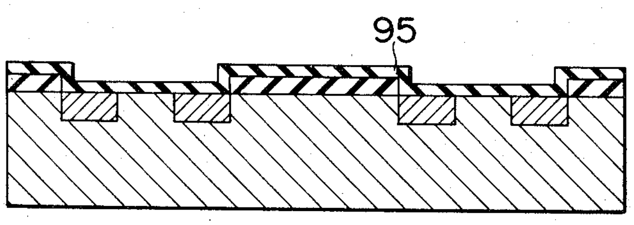
Figure 37:
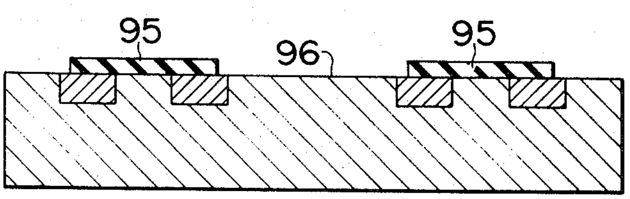
Figure 38:
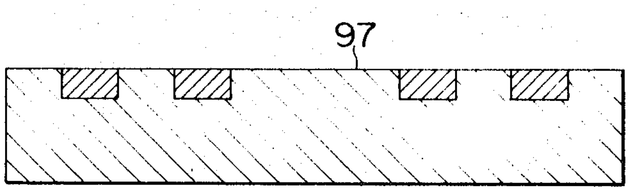
Figure 39:
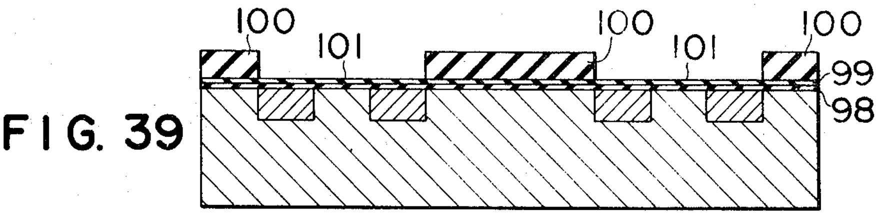

After the aluminum silicate glass film 112 containing the desired amount of $Al_2O_3$ is deposited to the thickness of about 5,000A, the aluminum silicate glass film 112 is selectively photoetched thereby to form apertures 113, exposing the gate regions of the FET's. An $SiO_2$ film 114 as thick as 500A and a phosphosilicate glass film 115 are formed successively on the substrate surface by the CVD method. Apertures for electrodes are created and aluminium 8,000A thick is deposited in them thereby to form the electrodes 116 and 118 of FET's. The reference numerals 116, 117 and 118 in FIG. 29 show source, drain and gate electrodes respectively. Through these processes, N-channel enhancement FET's are formed in the surface of the P-type silicon substrate, while at the same time sufficiently isolating the FET's from each other.

The insulating film used for isolation in this embodiment is thicker than 5,000A and therefore smaller in capacitance.

Although the temperature of the alkali solution is set at 80°C and the period for treatment with it at 10 minutes in this embodiment, the effects of the present invention are also achieved with other combinations of quantities. According to our laboratory tests, the effect of the treatment with the alkali solution begins to be produced in 2 or 3 minutes but is soon saturated, and therefore almost the same effect is obtained no matter how long the specimen is treated with it, 5, 10 or 30 minutes. It is only for the reason of safety that the specimen is treated in the alkali solution for 10 minutes. As to the temperature of the alkali solution, it has been empirically confirmed that the alkali solution is highly effective within the range of temperatures from 60°C to 100°C. Even under 60°C, the treatment with the alkali solution has some effect.

The field effect transistors formed in the surface of a semiconductor substrate according to this embodiment are all of the N-channel enhancement type. This embodiment is in no way limited to such FET's but it is possible to partly form depletion type FET's. In such a case, care is taken to protect the gate regions of the FET's with an $SiO_2$ film or the like when the substrate surface is treated with an alkali solution.

A similar effect is obtained if, instead of the aluminum silicate glass film used in the embodiment 12, a zinc silicate glass film is employed while varying the doped quantity of Zn in the zinc silicate glass film which is formed by the CVD method.

It will be understood from the foregoing detailed description of the embodiments that 1. The treatments according to the present invention extremely reduce the channel layer due to electrons which are always induced by an $SiO_2$ film in the conventional methods, or, if necessary, the treatments are capable of converting the channel from N to P type.

2. According to the present invention, the density of surface charges in the channel can be controlled as desired. This is quite impossible to achieve in the well-known methods of surface treatment of semiconductors.

3. The possibility of forming a P channel as mentioned above means that it is easy to produce in the surface of a semiconductor device P-channel depletion type field effect transistors which it has so far been considered to manufacture. In addition, PNP-type planar transistors can be manufactured more easily. In an ordinary PNP planar transistor with its P-type collector surface usually consisting of a high-resistance silicon and covered with a protective film of $SiO_2$, the silicon surface is generally converted into the N conduction type, so that it is assimilated with the base layer of N conduction type with the result that the base area is extremely enlarged, thereby increasing a reverse current and capacitance for deteriorated characteristics. A conventional method for preventing this consists in forming a ring-shaped $P^+$-type diffused layer around the base layer so as to cut off the N channel by means of the high-concentration P type layer. (Please see Japanese Patent Publication No. 24999/64.) Even with this method, however, the N channel develops inevitably inside of the ring-shaped $P^+$-type layer. Also, this method has the disadvantage that another process has to be added for the diffusion of the $P^+$-type layer. According to the present invention, by contrast, if an appropriate way of the surface treatment is selected, no N channel is induced by the $SiO_2$ film and therefore elements with as good characteristics as those of an NPN type planar transistor are obtained. Further, since the diffusion mask of $SiO_2$ which is used to form a junction is temporarily removed, noises can be reduced even more by doing the treatment according to the present invention simply after etching off an impurity layer which develops on the Si side in the boundary between the $SiO_2$ film and the silicon substrate.

4. Isolation between N-channel MIS field effect transistors which has hitherto been difficult can be easily performed according to the present invention in which positive holes for isolation are easily created by means of treatment with an alkali solution. Therefore, the present invention is expected to greatly improve the work efficiency in the factory.

5. The thresold voltage $V_T$ of the portions providing isolation is easily controlled and the productivity is high, because, in this invention, the threshold voltage is controlled either by varying the concentration of the alkali solution or by a combination of the concentration of the alkali solution and the film deposited on the substrate surface.

6. By treating the gate regions and the isolating portions between elements with the alkali solution, N-channel enhancement MIS field effect transistors can be formed simultaneously with the isolating portions.

7. Unlike the conventional methods, isolation can be provided in MIS integrated circuits and MIS LSI's which use protective films of $SiO_2$ or phosphosilicate glass.

8. Acceleration tests by applying an electric field of $10^6$ V/cm at 250°C show that the elements treated with the alkali solution are relatively stable in comparison with those not so treated.

It is needless to say that the present invention is not limited to the above-mentioned embodiments but is applicable to various other modifications without departing from the spirit and scope of the invention.

What is claimed is:

1. In a method of manufacturing semiconductor devices with an insulating thin film on the surface of a semiconductor substrate, the improvement wherein said surface of said semiconductor substrate is treated with a solution containing an alkali solution before depositing said insulating thin film on said surface of said semiconductor substrate.

2. A method of manufacturing semi-conductor devices according to claim 1, in which said alkali solution comprises one selected from the group consisting of hydrazine, trimethylammonium hydroxide, $NH_4OH$, NaOH and KOH.

3. A method of manufacturing semiconductor devices according to claim 1, in which said semiconductor substrate comprises one selected from the group consisting of Si, Ge, GaAs, InSb and $GaAs_{1-x}P_x$.

4. A method of manufacturing semiconductor devices according to claim 1, in which said surface of said semiconductor substrate is treated with said solution for three minutes or more.

5. A method of manufacturing semiconductor devices according to claim 1, in which said insulating film deposited on said surface of said semiconductor substrate comprises one selected from the group consisting of $SiO_2$, $Si_3N_4$, $P_2O_5{\cdot}SiO_2$, $PbO{\cdot}SiO_2$, $B_2O_3{\cdot}SiO_2$, $Al_2O_3{\cdot}SiO_2$, $ZnO_2{\cdot}SiO_2$ and $TiO_2$.

6. A method of manufacturing semiconductor devices according to claim 1, in which said solution containing said alkali solution for treating said surface of said semiconductor substrate comprises an oxidizing agent including $H_2O_2$.

7. A method of manufacturing semiconductor devices according to claim 1, in which said semiconductor substrate is heated in an inert atmosphere after depositing said insulating thin film on said surface of said semiconductor substrate.

8. A method of manufacturing semiconductor devices according to claim 7, in which said semiconductor substrate is heated at a temperature between 800°C and the melting point of said semiconductor substance, thereby stabilizing the electrical characteristics of said semiconductor devices.

9. A method of manufacturing insulated gate field effect transistors comprising steps of forming source and drain regions at a predetermined distance from each other of said insulated gate field effect transistors by adding to the surface of a semiconductor substrate impurities of a conduction type opposite to that of said substrate, exposing the portions of said surface of said semiconductor substrate between said source and drain regions to a solution containing an alkali solution, and depositing a gate insulating film on said portions of said surface of said semiconductor substrate between said source and drain regions.

10. A method of manufacturing insulated gate field effect transistors according to claim 9, in which said semiconductor substrate is heated in an inert atmosphere after depositing said gate insulating film on said portions of said surface of said semiconductor substrate between said source and drain regions.

11. A method of manufacturing insulated gate field effect transistors according to claim 10, in which said semiconductor substrate is heated at a temperature between 800°C and the melting point of said semiconductor substrate.

12. A method of manufacturing insulated gate field effect transistors according to claim 9, in which the surface of said semiconductor substrate is treated with said solution containing said alkali solution to which a predetermined amount of an oxidizing agent including $H_2O_2$ is added, whereby the amount of charges induced in the portion of said surface of said semiconductor substrate directly under said gate insulating film is reduced to a predetermined level.

13. A method of manufacturing insulated gate field effect transistors according to claim 9, in which said alkali solution comprises one selected from the group consisting of hydrazine, trimethylammonium hydroxide, $NH_4OH$, NaOH and KOH.

14. A method of manufacturing semiconductor devices comprising steps of forming the source and drain regions of a first insulated gate field effect transistor in a main surface of a semiconductor substrate, forming the source and drain regions of a second insulated gate field effect transistor at a predetermined distance from said first insulated gate field effect transistor, and forming first and second insulating films respectively on the portions of said semiconductor substrate between said source and drain regions of said first and second insulated gate field effect transistors; said portion of said semiconductor substrate between said source and drain regions of said first insulated gate field effect transistor being treated with a solution containing an alkali solution immediately before depositing said first insulating film on said surface of said semiconductor substrate.

15. A method of manufacturing semiconductor devices according to claim 14, in which said alkali solution comprises one selected from the group consisting of hydrazine, trimethylammonium hydroxide, $NH_4OH$, NaOH and KOH.

16. A method of manufacturing semiconductor devices according to claim 14, in which a predetermined amount of an oxidizing agent including $H_2O_2$ is added to said alkali solution in order to reduce to a predetermined level the amount of electric charges induced in the portion of the surface of said semiconductor substrate immediately under said first insulating film of said first insulated gate field effect transistor.

17. A method of manufacturing semiconductor devices according to claim 14, in which said semiconductor substrate is heated at a temperature between 800°C and the melting point of said semiconductor substrate after forming said first and second insulating films on said surface of said semiconductor substrate.

18. A method of manufacturing semiconductor device comprising steps of forming the source and drain regions of first and second MIS field effect transistors respectively in a main surface of a semiconductor substrate, treating the portion of the surface of said semiconductor substrate between said first and second MIS field effect transistors with a solution containing an alkali solution, and depositing an insulating film on said surface of said semiconductor substrate.

19. A method of manufacturing semiconductor devices according to claim 18, in which said insulating film comprises one selected from the group consisting of $SiO_2$, $Si_3N_4$, $P_2O_5{\cdot}SiO_2$, $B_2O_3{\cdot}SiO_2$, $Al_2O_3$, $Al_2O_3{\cdot}SiO_2$, $PbO{\cdot}SiO_2$, $ZnO_2{\cdot}SiO_2$ and $TiO_2$.

20. A method of manufacturing semiconductor devices according to claim 18, in which the portion of said surface of said semiconductor substrate between said first and second MIS field effect transistors is treated with a first alkali solution, while one or both of the gate regions of said first and second MIS field effect transistors is treated with a second alkali solution of a lower concentra-tion than that of said first alkali solution.

21. A method of manufacturing semiconductor devices comprising steps of forming the surface and drain regions of an $N^+$ conduction type of first and second MIS field effect transistors by selectively introducing N-type impurities into the surface of a silicon substrate of P conduction type, treating said surface of the substrate with an alkali solution, and forming an $SiO_2$ film or a duplix film consisting of $SiO_2$ and phosphosilicate glass films on the gate regions of said field effect transistors and an $Al_2O_3$ film on the portion of the surface of said silicon substrate between said first and second MIS field effect transistors.

* * * * *